(12) United States Patent
Takei et al.

(10) Patent No.: US 9,134,610 B2
(45) Date of Patent: Sep. 15, 2015

(54) RESIST UNDERLAYER COATING FORMING COMPOSITION FOR FORMING PHOTO-CROSSLINKING CURED RESIST UNDERLAYER COATING

(71) Applicant: NISSAN CHEMICAL INDUSTRIES, LTD., Tokyo (JP)

(72) Inventors: Satoshi Takei, Toyama (JP); Tetsuya Shinjo, Toyama (JP); Motohiko Hidaka, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 13/797,009

(22) Filed: Mar. 12, 2013

(65) Prior Publication Data
US 2013/0189850 A1    Jul. 25, 2013

Related U.S. Application Data (62) Division of application No. 11/918,135, filed as application No. PCT/JP2006/307665 on Apr. 11, 2006, now Pat. No. 8,426,111.

(30) Foreign Application Priority Data

Apr. 19, 2005   (JP) .................................. 2005-120692
Sep. 1, 2005    (JP) .................................. 2005-253922

(51) Int. Cl.
| | | |
|---|---|---|
| *G03F 7/11* | (2006.01) | |
| *G03F 7/20* | (2006.01) | |
| *H01L 21/027* | (2006.01) | |
| *G03F 7/09* | (2006.01) | |
| *G03F 7/16* | (2006.01) | |

(52) U.S. Cl.
CPC ........ *G03F 7/091* (2013.01); *G03F 7/11* (2013.01); *G03F 7/161* (2013.01); *H01L 21/0271* (2013.01)

(58) Field of Classification Search
None
See application file for complete search history.

(56) References Cited

U.S. PATENT DOCUMENTS

| | | | | |
|---|---|---|---|---|
| 4,362,809 A | * | 12/1982 | Chen et al. ................... | 430/312 |
| 4,370,405 A | * | 1/1983 | O'Toole et al. ............... | 430/312 |
| 4,553,153 A | * | 11/1985 | McColgin et al. ........... | 257/435 |
| 4,609,614 A | * | 9/1986 | Pampalone et al. .......... | 430/323 |
| 5,166,035 A | * | 11/1992 | Kanno et al. ............. | 430/270.15 |
| 5,166,126 A | | 11/1992 | Harrison et al. | |
| 5,877,229 A | | 3/1999 | Janke et al. | |
| 5,919,599 A | | 7/1999 | Meador et al. | |
| 5,994,110 A | | 11/1999 | Mosbach et al. | |
| 6,503,421 B1 | | 1/2003 | Wang et al. | |
| 6,797,450 B2 | | 9/2004 | Suzuki et al. | |
| 2001/0038890 A1 | | 11/2001 | Buazza et al. | |
| 2002/0177070 A1 | | 11/2002 | Kozawa et al. | |
| 2003/0004221 A1 | | 1/2003 | Sakurai et al. | |
| 2003/0149124 A1 | | 8/2003 | Thommes et al. | |
| 2003/0158286 A1 | | 8/2003 | Nishizaki et al. | |
| 2003/0215736 A1 | | 11/2003 | Oberlander et al. | |
| 2004/0029041 A1 | | 2/2004 | Shih et al. | |
| 2004/0112862 A1 | * | 6/2004 | Willson et al. ................... | 216/66 |
| 2004/0253461 A1 | | 12/2004 | Ogihara et al. | |
| 2005/0231551 A1 | | 10/2005 | Gibson et al. | |
| 2005/0279995 A1 | * | 12/2005 | Shin et al. ....................... | 257/40 |
| 2006/0023173 A1 | | 2/2006 | Mooradian et al. | |
| 2006/0023757 A1 | | 2/2006 | Mooradian et al. | |
| 2006/0079592 A1 | | 4/2006 | Yoshikawa et al. | |
| 2006/0210915 A1 | | 9/2006 | Takei et al. | |
| 2006/0268241 A1 | | 11/2006 | Watson et al. | |
| 2006/0280219 A1 | | 12/2006 | Shchegrov | |
| 2007/0153862 A1 | | 7/2007 | Shchegrov et al. | |
| 2007/0153866 A1 | | 7/2007 | Shchegrov et al. | |
| 2007/0238029 A1 | | 10/2007 | Takei et al. | |

FOREIGN PATENT DOCUMENTS

| | | |
|---|---|---|
| JP | A-01-117032 | 5/1989 |
| JP | 05-255418 A * | 10/1993 |
| JP | A-2000-294504 | 10/2000 |
| JP | A-2002-47430 | 2/2002 |
| JP | A-2002-128847 | 5/2002 |
| JP | A-2002-190519 | 7/2002 |
| JP | A-2004-212907 | 7/2004 |
| JP | A-2004-309561 | 11/2004 |
| JP | A-2005-15779 | 1/2005 |
| JP | A-2005-70154 | 3/2005 |

(Continued)

OTHER PUBLICATIONS

English translation of JP, 05-255418 a, A (1993) from machine translation from AIPN Japan Patent Office National center for Industrial Property Information and Training, generated Sep. 6, 2013, 9 pages.*
Lossow, et al "Photoresist Materials and Applications", Journal of Vaccum Science and Technology, vol. 6, No. 1, year pp. 18-24.*
Sigma-Aldrich, Proplyene glycol monomethyl ether acetate, http://www.sigmaaldrich.com/catalog/product/sial/484431?lang=en&region=US, two pages.*
Ultraviolet Radiation, Canadian Centre for Occupational Health and Safety, last updated Jul. 27, 2005, http://www.ccohs.ca/oshanswers/phys_agents/ultravioletradiation.html?print, 7 pages pulled from the web on Mar. 9, 2012.

(Continued)

*Primary Examiner* — Cynthia Hamilton
(74) *Attorney, Agent, or Firm* — Oliff PLC (57) ABSTRACT

An underlayer coating is used as an underlayer of photoresists in lithography process of the manufacture of semiconductor devices and has a high dry etching rate in comparison to the photoresists, does not intermix with the photoresists, and is capable of flattening the surface of a semiconductor substrate having holes of a high aspect ratio; and an underlayer coating forming composition can form the underlayer coating. The underlayer coating forming composition for forming by light irradiation an underlayer coating used as an underlayer of a photoresist in a lithography process of the manufacture of semiconductor devices, includes a polymerizable substance and a photopolymerization initiator.

16 Claims, 1 Drawing Sheet

(56) References Cited

FOREIGN PATENT DOCUMENTS

| | | |
|---|---|---|
| JP | A-2005-115532 | 4/2005 |
| JP | A-2005-300825 | 10/2005 |
| WO | WO 02/05035 A1 | 1/2002 |
| WO | WO 03/038887 A1 | 5/2003 |
| WO | WO 03/058345 A2 | 7/2003 |
| WO | WO 03/073164 A2 | 9/2003 |
| WO | WO 2005/013601 A1 | 2/2005 |
| WO | WO-2005/053017 A1 * | 6/2005 |
| WO | WO 2005/098542 A1 | 10/2005 |
| WO | WO 2005/111724 A1 | 11/2005 |
| WO | WO 2006/003850 A1 | 1/2006 |

OTHER PUBLICATIONS

Uchino et al. (Chapter 19, pp. 321-331) of Riechmanis et al., In polymers in Microlithography, ACS Symposium Series, American Chemical Society, Washington, DC, 1989 publication date Oct. 31, 1980.

Iwashima et al., Journal of Photopolymer Science and Technology, vol. 16, No. 1, 2003, pp. 91-96.

EPA Technical Bulletin 456/K-01-001, Ultraviolet and Electron Beam (UV/EB) Cured Coatings, Inks and Adhesives, Jul. 2001, 99 pages in total.

Irfan, Chemistry and Technology of Thermosetting polymer in Construction Applications, Kluwer Academic Publishers, Norwell, MA 1998, two cover pages and pp. 8-28.

DOW Epoxy Novolac Resins High-temperature, High Performance Epoxy Resins, Dow Chemical Company, Midland MI, published Oct. 1998, 27 pages obtained from http://epoxy.dow.com/epoly/tech/#nov on Dec. 4, 2010.

DOW, "Expoxy Resins Selection Guide," The DOW Chemical Company, Midland Michigan, downloaded from the internet on Sep. 12, 2009, 20 pages from http://www.univareurope.com/uploads/documents/uk/CS3_epoxy_resin_selection_guide.pdf.

English language translation of first Chinese Office Action in Chinese Application No. 200680013280.3.

English language translation of second Chinese Office Action in Chinese Application No. 200680013280.3.

English language translation of third Chinese Office Action in Chinese Application No. 200680013280.3.

Supplemental European Search Report for European Application No. EP 06 73 1612, mailed Aug. 26, 2010.

* cited by examiner

RESIST UNDERLAYER COATING FORMING COMPOSITION FOR FORMING PHOTO-CROSSLINKING CURED RESIST UNDERLAYER COATING

This is a divisional of application Ser. No. 11/918,135 filed Oct. 19, 2007, which in turn is a U.S. National Stage Application of PCT/JP2006/307665 filed Apr. 11, 2006, which claims benefit of Japanese Patent Application No. 2005-120692 filed Apr. 19, 2005 and Japanese Patent Application No. 2005-253922 filed Sep. 1, 2005. The disclosure of the prior applications is hereby incorporated by reference herein in its entirety.

TECHNICAL FIELD

The present invention relates to a composition for forming an underlayer coating between a semiconductor substrate and a photoresist. Specifically, the present invention relates to an underlayer coating forming composition for forming by light irradiation an underlayer coating used as an underlayer of a photoresist in a lithography process of the manufacture of semiconductor devices. The present invention also relates to a method for forming an underlayer coating by use of the underlayer coating forming composition, and a method for forming a photoresist pattern.

BACKGROUND ART

Conventionally, in the manufacture of semiconductor devices, micro-processing by lithography using a photoresist has been carried out. The micro-processing is a processing method comprising forming a thin coating of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective coating, thereby forming fine unevenness corresponding to the pattern on the surface of the substrate.

In recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of actinic rays from a substrate have become serious problems. Accordingly, it has been widely studied to provide an anti-reflective coating between the photoresist and the substrate (bottom anti-reflective coating) in order to resolve the problem. As the anti-reflective coating, from a viewpoint of easy of use or the like, many considerations have been done on organic anti-reflective coatings (see, for example Patent Document 1).

In recent years, in order to solve interconnection delay that has become clear with miniaturization in pattern rule of semiconductor devices, it has been also considered to use copper as interconnect material, and to apply Dual Damascene process as interconnect forming method on the semiconductor substrate. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like. However, it is difficult to apply organic material for anti-reflective coating on a substrate having a high aspect ratio, and in recent years, material with particular emphasis on filling property or flattening property has been developed (see, for example Patent Documents 2, 3, 4 and 5).

In addition, in the production of devices such as semiconductor devices, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example Patent Document 6).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist.

On the other hand, the above-mentioned organic underlayer coating is formed by applying an underlayer coating forming composition on a semiconductor substrate, and then heating the semiconductor substrate at a high temperature of about 170° C. to 200° C. Therefore, components with a low molecular weight contained in the underlayer coating forming composition are volatilized or sublimated on heating at the high temperature, and this causes problems that the volatized or sublimated components adhere on peripheral apparatuses and thus the apparatuses are polluted. Further, it becomes problems that the components adhered to the apparatuses fall on the semiconductor substrate and it exerts a harmful influence on patter formation.

Patent Document 1: U.S. Pat. No. 5,919,599
Patent Document 2: JP2000-294504
Patent Document 3: JP2002-47430
Patent Document 4: JP2002-190519
Patent Document 5: WO 02/05035 pamphlet
Patent Document 6: JP2002-128847

DISCLOSURE OF INVENTION

Problems to be Solved by the Invention

An object of the present invention is to provide an underlayer coating forming composition for forming by light irradiation an underlayer coating used as an underlayer of a photoresist in a lithography process of the manufacture of semiconductor devices. Another object is to provide a method for forming an underlayer coating used as an underlayer of a photoresist in a lithography process of the manufacture of semiconductor devices by use of the composition, and a method for forming a photoresist pattern.

In addition, an object of the present invention is to provide an underlayer coating that causes no intermixing with a photoresist applied and formed as an upper layer and that has a high dry etching rate compared with the photoresist, and an underlayer coating forming composition for forming the underlayer coating.

Further, an object of the present invention is to provide an underlayer coating forming composition for forming an underlayer coating formed by light irradiation that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist due to substances generated from a semiconductor substrate on baking under heating, and the like.

Still further, an object of the present invention is to provide a method for filling holes of an aspect ratio shown in height/diameter of 1 or more, formed on a semiconductor substrate with an underlayer coating formed by light irradiation.

Means for solving the Problem

Taking the above-mentioned present status into account, the present inventors eagerly investigated, and as a result, they found that an excellent underlayer coating can be formed from a composition containing a polymerizable compound and a photopolymerization initiator by light irradiation.

The present invention relates to the following aspects:

as a first aspect, an underlayer coating forming composition for forming by light irradiation an underlayer coating used as an underlayer of a photoresist in a lithography process of the manufacture of semiconductor devices, comprising a polymerizable substance and a photopolymerization initiator;

as a second aspect, the underlayer coating forming composition according to the first aspect, wherein the polymerizable substance is a polymerizable compound having at least one cationic polymerizable reactive group, and the photopolymerization initiator is a photo-cationic polymerization initiator;

as a third aspect, the underlayer coating forming composition according to the first aspect, wherein the polymerizable substance is a polymerizable compound having at least one radical polymerizable ethylenically unsaturated bond, and the photopolymerization initiator is a photo-radical polymerization initiator;

as a fourth aspect, the underlayer coating forming composition according to the first aspect, wherein the polymerizable substance is a polymer compound having at least one cationic polymerizable reactive group, and the photopolymerization initiator is a photo-cationic polymerization initiator;

as a fifth aspect, the underlayer coating forming composition according to the second aspect, wherein the polymerizable compound having at least one cationic polymerizable reactive group is a polymerizable compound having 2 to 4 epoxy rings;

as a sixth aspect, the underlayer coating forming composition according to the second aspect, wherein the polymerizable compound having at least one cationic polymerizable reactive group is a polymerizable compound having 2 to 4 oxetane rings;

as a seventh aspect, the underlayer coating forming composition according to the fourth aspect, wherein the polymer compound having at least one cationic polymerizable reactive group is a polymer compound of formula (1):

(1)

in formula (1), P is a linking group constituting a polymer backbone, Q is a direct bond or a linking group, or formula (2):

in formula (2), P is a linking group constituting a polymer backbone, Q is a direct bond or a linking group;

as an eighth aspect, the underlayer coating forming composition according to the seventh aspect, wherein in formulae (1) and (2), P is alkylene group, a derivative thereof or an organic group derived from an alicyclic compound or an aromatic compound, Q is a single bond, or an organic group having an ester bond, ether bond or amide bond;

as a ninth aspect, the underlayer coating forming composition according to the second or fourth aspect, wherein the photo-cationic polymerization initiator is an aromatic sulfonium salt compound;

as a tenth aspect, a method for forming an underlayer coating used as an underlayer of a photoresist in a lithography process of the manufacture of semiconductor devices, comprising the steps of:

applying the underlayer coating forming composition according to any one of the first to ninth aspects on a semiconductor substrate to form an applied coating, and irradiating the applied coating with light to form an underlayer coating;

as an eleventh aspect, a method for forming a laminated structure of an underlayer coating and a photoresist used in a lithography process of the manufacture of semiconductor devices, comprising the steps of:

applying the underlayer coating forming composition according to any one of the first to ninth aspects on a semiconductor substrate to form an applied coating, irradiating the applied coating with light to form an underlayer coating, and applying a photoresist composition on the underlayer coating and heating it to form a photoresist;

as a twelfth aspect, a method for forming a photoresist pattern used in a lithography process of the manufacture of semiconductor devices, comprising the steps of:

applying the underlayer coating forming composition according to any one of the first to ninth aspects on a semiconductor substrate to form an applied coating, irradiating the applied coating with light to form an underlayer coating, applying a photoresist composition on the underlayer coating and heating it to form a photoresist, exposing the semiconductor substrate coated with the underlayer coating and the photoresist to light, and developing the photoresist after the exposure to light;

as a thirteenth aspect, the method according to any one of the tenth to twelfth aspects, wherein the semiconductor substrate is a semiconductor substrate having hole of an aspect ratio shown in height/diameter of 1 or more; and as a fourteenth aspect, the method according to any one of the tenth to thirteenth aspects, wherein the light irradiation is carried out by light having a wavelength of 193 nm to 700 nm.

Effect of the Invention

The underlayer coating forming composition of the present invention can form by light irradiation an excellent underlayer coating that has a high dry etching rate compared with photoresists, and cause no intermixing with photoresists.

The underlayer coating forming composition of the present invention can also flatten the surface of semiconductor substrate having holes an aspect ratio shown in height/diameter of 1 or more. Therefore, the film thickness of photoresists or the like applied and formed on the underlayer coating can be improved in uniformity. Further, good photoresist pattern can be formed even in the process by use of substrates having holes.

The underlayer coating forming composition of the present invention can fill holes formed on semiconductor substrates with an underlayer coating without occurrence of gap (void).

In addition, the underlayer coating forming composition of the present invention can form an underlayer coating by light irradiation without heating at a high temperature. Therefore, the pollution of the peripheral apparatuses due to the volatilization or sublimation of components with a low molecular weight can be prevented. Further, as no heating at a high temperature is required, the present invention has no concern for sublimation or the like even when it uses components with a low molecular weight for underlayer coating forming compositions, and it can use components with a low molecular weight in a relatively high content for underlayer coating forming compositions. Thus, an underlayer coating can be formed by using an underlayer coating forming composition having a relatively low viscosity. In addition, an underlayer coating excellent in filling property of holes and flattening property of semiconductor substrates can be formed.

BEST MODE FOR CARRYING OUT THE INVENTION

The underlayer coating forming composition of the present invention is a composition for forming by light irradiation an underlayer coating used as an underlayer of a photoresist in a lithography process of the manufacture of semiconductor devices. And the underlayer coating forming composition of the present invention contains a polymerizable substance and a photopolymerization initiator. In addition, the underlayer coating forming composition of the present invention can comprise other components such as a surfactant and a sensitizer, etc.

<Polymerizable Substance>

The polymerizable substance used in the present invention is a polymerizable compound having at least one cationic polymerizable reactive group, a polymerizable compound having at least one radical polymerizable ethylenically unsaturated bond, or a polymer compound having at least one cationic polymerizable reactive group.

Polymerizable Compound

The polymerizable compound in the underlayer coating forming composition of the present invention is not specifically limited so long as it is a compound having one or more polymerizable moiety that polymerizes by the action of the photopolymerization initiator mentioned below. From viewpoint that it forms an underlayer coating having a low solubility in an organic solvent, compounds having two or more, for example 2 to 6, or 3 to 4 polymerizable moieties are preferably used as the polymerizable compound in the underlayer coating forming composition of the present invention.

The polymerizable moiety includes ethylenically unsaturated bond being radical polymerizable moiety. In addition, the polymerizable moiety includes cyclic ether structure such as epoxy ring and oxetane ring, etc., vinyl ether structure and vinyl thioether structure, and the like, which are cationic polymerizable moieties. As the polymerizable compound, compounds that are liquid at room temperature (about 20° C.) are preferably used. As to molecular weight of the polymerizable compound, it is preferable to have a weight average molecular weight of 100 or more (in terms of standard polystyrene). The molecular weight is for example 100 to 2000, or 150 to 1500, or 300 to 1000, or 400 to 800.

The polymerizable compound having ethylenically unsaturated bond is not specifically limited, and includes for example unsaturated carboxylic acid compounds such as acrylic acid, methacrylic acid, itaconic acid, crotonic acid, maleic acid and phthalic acid, etc. In addition, unsaturated carboxylic acid ester compounds or unsaturated carboxylic acid amide compounds derived from the above-mentioned unsaturated carboxylic acid compounds and alcohol compounds or amine compounds can be mentioned. Examples of them are acrylic acid ester compounds, methacrylic acid ester compounds, itaconic acid ester compounds, crotonic acid ester compounds, maleic acid ester compounds, phthalic acid ester compounds, acrylic acid amide compounds, methacrylic acid amide compounds, itaconic acid amide compounds, crotonic acid amide compounds, maleic acid amide compounds and phthalic acid amide compounds, etc. The alcohol compounds are not specifically limited, and include for example polyol compounds having 2 to 6 hydroxy groups, such as ethylene glycol, triethylene glycol, tetraethylene glycol, tris(2-hydroxyethyl)isocyanuric acid, triethanol amine and pentaerythritol, etc. The amine compounds are not specifically limited, and include for example polyamine compounds having 2 to 6 primary or secondary amino groups, such as ethylene diamine, diaminocyclohexane, diaminonaphthalene, 1,4-bis(aminomethyl)cyclohexane, 3,3',4,4'-tetraaminobiphenyl, and tris(2-aminoethyl)amine, etc.

Specific examples of the polymerizable compound having ethylenically unsaturated bond are ethylene glycol di(meth)acrylate, diethylene glycol di(meth)acrylate, triethylene glycol di(meth)acrylate, tetraethylene glycol di(meth)acrylate, nonaethylene glycol di(meth)acrylate, polyethylene glycol di(meth)acrylate, tripropylene glycol di(meth)acrylate, tetrapropylene glycol di(meth)acrylate, nonapropylene glycol di(meth)acrylate, polypropylene glycol di(meth)acrylate, 2,2-bis[4-(acryloxydiethoxy)phenyl]propane, 2,2-bis[4-(methacryloxydiethoxy)phenyl]propane, 3-phenoxy-2-propanoyl acrylate, 1,6-bis(3-acryloxy-2-hydroxypropyl)-hexyl ether, pentaerythritol tri(meth)acrylate, trimethyrol propane tri(meth)acrylate, glycerol tri(meth)acrylate, tris(2-hydroxyethyl)-isocyanuric acid ester(meth)acrylate, pentaerythritol tetra(meth)acrylate, dipentaerythritol penta(meta)acrylate, and dipentaerythritol hexa(meth)acrylate, etc. In the meantime, in the specification, for example ethylene glycol di(meth)acrylate means ethylene glycol diacrylate and ethylene glycol dimethacrylate.

The polymerizable compound having ethylenically unsaturated bond in the present invention includes also urethane compounds that can be obtained by reaction between a polyvalent isocyanate compound and a hydroxyalkyl unsaturated carboxylic acid ester compound, compounds that can be obtained by reaction between a polyvalent epoxy compound and a hydroxyalkyl unsaturated carboxylic acid ester compound, diallyl ester compounds such as diallyl phthalate, etc., and divinyl compounds such as divinyl phthalate, etc., and the like.

The polymerizable compound having cationic polymerizable moiety includes compounds having cyclic ether structure such as epoxy ring and oxetane ring, etc., vinyl ether structure and vinyl thioether structure, and the like.

The polymerizable compound having epoxy ring is not specifically limited and compounds having 1 to 6, or 2 to 4 epoxy rings can be used. The polymerizable compounds having epoxy ring include compounds having 2 or more glycidyl ether structures or glycidyl ester structures that can be produced from a compound having 2 or more hydroxy groups or carboxy groups, such as a diol compound, a triol compound, a dicarboxylic acid compound and a tricarboxylic acid compound, etc., and a glycidyl compound such as epichlorohydrin, etc.

Specific examples of the polymerizable compound having epoxy ring that can be mentioned are 1,4-butanediol glycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylenebis(N,N-diglycidylaniline), 3,4-epoxycyclohexylmethyl-3,4-epoxycyclohexane carboxylate, trimethylol ethane triglycidyl ether, triglycidyl-p-aminophenol, tetraglycidyl metaxylenediamine, tetraglycidyl diaminodiphenyl methane, tetraglycidyl-1,3-bisaminomethylcyclohexane, bisphenol-A-diglycidyl ether, bisphenol-S-diglycidyl ether, pentaerythritol tetraglycidyl ether, resorcinol diglycidyl ether, phthalic acid diglycidyl ester, neopentyl glycol diglycidyl ether, polypropylene glycol diglycidyl ether, tetrabromo bisphenol-A-diglycidyl ether, bisphenol hexafluoroacetone diglycidyl ether, pentaerythritol diglycidyl ether, tris-(2,3-epoxypropyl)isocyanurate, monoallyldiglycidyl isocyanurate, diglycerol polyglycidyl ether, pentaerythritol polyglycidyl ether, 1,4-bis(2,3-epoxypropoxyperfluoroisopropyl)cyclohexane, sorbitol polyglycidyl ether, trimethyrolpropane polyglycidyl ether, resorcin diglycidyl ether, 1,6-hexanediol diglycidyl ether, polyethylene glycol diglycidyl ether, phenyl glycidyl ether, p-tert-butylphenyl glycidyl ether, adipic acid diglycidyl ether, o-phthalic acid diglycidyl ether, dibromophenyl glycidyl ether, 1,2,7,8-diepoxyoctane, 1,6-dimethyrolperfluorohexane diglycidyl ether, 4,4'-bis(2,3-epoxypropoxyperfluoroisopropyl)diphenyl ether, 2,2-bis(4-glycidyloxyphenyl)propane, 3,4-epoxycyclohexylmethyl-3',4'-epoxycyclohexane carboxylate, 3,4-epoxycyclohexyl oxirane, 2-(3,4-epoxycyclohexyl)-3',4'-epoxy-1,3-dioxane-5-spirocyclohexane, 1,2-ethylenedioxy-bis(3,4-epoxycyclohexylmethane), 4',5'-epoxy-2'-methylcyclohexylmethyl-4,5-epoxy-2-methylcyclohexane carboxylate, ethylene glycol-bis(3,4-epoxycyclohexanecarboxylate), bis-(3,4-epoxycyclohexylmethyl)adipate, and bis(2,3-epoxycyclopentyl)ether, etc.

The polymerizable compound having oxetane ring is not specifically limited, and compounds having 1 to 6 or 2 to 4 oxetane rings can be used.

The polymerizable compound having oxetane ring includes for example 3-ethyl-3-hydroxymethyl oxetane, 3-ethyl-3-(phenoxymethyl)oxetane, 3,3-diethyl oxetane, and 3-ethyl-(2-ethylhexyloxymethyl)oxetane, 1,4-bis(((3-ethyl-3-oxetanyl)methoxy)methyl)benzene, di((3-ethyl-3-oxetanyl)methyl)ether, and pentaerythritol tetrakis((3-ethyl-3-oxetanyl)methyl)ether, etc.

The polymerizable compound having vinyl ether structure is not specifically limited, and compounds having 1 to 6 or 2 to 4 vinyl ether structures can be used.

The polymerizable compound having vinyl ether structure includes for example vinyl-2-chloroethyl ether, vinyl-n-butyl ether, 1,4-cyclohexanedimethanol divinyl ether, vinylglycidyl ether, bis(4-(vinyloxymethyl)cyclohexylmethyl)glutarate, tri(ethyleneglycol)divinyl ether, adipic acid divinyl ester, diethylene glycol divinyl ether, tris(4-vinyloxy)butyl trimellitate, bis(4-vinyloxy)butyl)terephthalate, bis(4-vinyloxy)butylisophthalate, ethylene glycol divinyl ether, 1,4-butanediol divinyl ether, tetramethylene glycol divinyl ether, tetraethylene glycol divinyl ether, neopentyl glycol divinyl ether, trimethylol propane vinyl ether, trimethylol ethane trivinyl ether, hexanediol divinyl ether, 1,4-cyclohexanediol divinyl ether, tetraethylene glycol divinyl ether, pentaerythritol divinyl ether and pentaerythritol trivinyl ether, etc.

Polymer compound having cationic polymerizable reactive group The polymer compound in the underlayer coating forming composition of the present invention is not specifically limited so long as it is a polymer of compounds having one or more polymerizable moiety that polymerizes by the action of a photo-cationic polymerization initiator.

The polymer compound is shown by the structure of the above-mentioned formula (1) or (2), and has epoxy ring or oxetane ring, etc. that is a cationic polymerizable moiety.

In the above-mentioned formula (1) or (2), P is a linking group constituting a polymer backbone. Alkylene groups corresponding to P include ethylene group or propylene group, and the derivatives of alkylene groups that hydrogen atom on these organic groups is substituted with halogen atom (fluorine atom, chlorine atom, bromine atom) or with benzene ring can be used. When P is an alkylene group or a derivative thereof, the polymer compounds of formula (1) or (2) are acrylic acid- or methacrylic acid-based polymer compounds.

The organic group derived from aliphatic cyclic compounds that corresponds to P is a polymer of aliphatic polyvalent alcohol or aliphatic polyvalent carboxylic acid, and for example organic group corresponding to cyclohexane triol, cyclohexane tricarboxylic acid or the derivative thereof substituted with alkyl group or halogen atom can be used. When P is an organic group derived from an aliphatic cyclic compound, the polymer compounds of formula (1) or (2) are polyethers or polyesters.

As the organic group derived from aromatic compounds that corresponds to P, it can be used an organic group corresponding to a polymer of aromatic polyvalent alcohol, aromatic polyvalent carboxylic acid, or a novolak resin obtained by condensation between an aromatic alcohol compound and an aldehyde, or the derivative thereof substituted with alkyl group or halogen atom. When P is an organic group derived from an aromatic compound, the polymer compounds of formula (1) or (2) are phenol novolaks or naphthalene novolaks.

Q is a bond that links epoxy ring or oxetane ring pending from the backbone of these resins, and the bond is a direct bond (single bond) or a linking group. The linking group is a divalent organic group having an ester bond, ether bond or amide bond, etc.

The bond mode of ester bond (—COO—), ether bond (—O—) or amide bond (—CONH—) mentioned above as the linking group may be a mode in which the backbone of the resin and epoxy ring or oxetane ring are directly bonded, or a mode in which they are bonded through a divalent organic group containing the linking group.

When the polymer compound of the above-mentioned formula (1) or (2) is synthesized, a copolymer can be produced by using monomers being raw materials of the polymer compound together with other copolymerizable monomers, and the resulting copolymer can be used as the polymer compound in the present invention. The other copolymerizable monomers includes an addition polymerizable monomer such as an acrylic acid ester, a methacrylic acid ester, an acrylamide, a methacrylamide, a vinyl compound, styrene, maleimide, maleic anhydride, acrylonitrile or the like. In this case, the proportion of the structural unit of formula (1) or (2) to the structural unit of the addition polymerizable monomer in the obtained polymer compound is 10/1 to 1/10, or 5/1 to 1/5, or 3/1 to 1/3 in mass ratio.

The weight average molecular weight (in terms of standard polystyrene) of the polymer compound is 100 or more, for example 1000 to 200000, or 1500 to 50000, or 3000 to 50000, or 4000 to 30000. Examples of these polymer compounds are as follows.

(24)

(25)

(26)

(27)

(28)

(29)

(30)

(31)

(32)

(33)

(34)

(35)

(36)

(37)

(38)

(39)

(40)

<Photopolymerization Initiator>

The photopolymerization initiator in the underlayer coating forming composition of the present invention is not specifically limited so long as it can initiate the polymerization of the polymerizable substance by light irradiation. Compounds that generate an acid (Brønsted acid or Lewis acid), a base, a radical or a cation can be used.

For example, compounds that can generate an active radical by light irradiation and cause radical polymerization of the polymerizable compound, that is, photo-radical polymerization initiators, and compounds that can generate a cation species such as a protonic acid and a carbon cation, etc. by light irradiation and cause cation polymerization of the polymer compound and the polymer compound having polymerizable group, that is, photo-cationic polymerization initiators, and the like can be mentioned.

Light irradiation can be performed by use of light having a wavelength of 150 nm to 1000 nm, or 193 nm to 700 nm, or 300 nm to 600 nm. And, the following photopolymerization initiators are preferably used: the photo-radical polymerization initiator that generates an active radical, or the photo-cationic polymerization initiator that generates a cation species at an exposure value of 1 to 2000 mJ/cm$^2$, or 10 to 1500 mJ/cm$^2$, or 50 to 1000 mJ/cm$^2$.

The photo-radical polymerization initiator includes for example imidazole compounds, diazo compounds, bisimidazole compounds, N-arylglycine compounds, organic azide compounds, titanocene compounds, aluminate compounds, organic peroxides, N-alkoxypyridinium salt compounds, and thioxanthone compounds, etc. The azide compounds include p-azidebenzaldehyde, p-azideacetophenone, p-azidebenzoic acid, p-azidebenzalacetophenone, 4,4'-diazidechalcone, 4,4'-diazidediphenylsulfide, and 2,6-bis(4'-azidebenzal)-4-methylcyclohexanone, etc. The diazo compounds include 1-diazo-2,5-diethoxy-4-p-tolylmercaptobenzene borofluoride, 1-diazo-4-N,N-dimethylaminobenzene chloride, and 1-diazo-4-N,N-diethylaminobenzene borofluoride, etc. The bisimidazole compounds include 2,2'-bis(o-chlorophenyl)-4,5,4',5'-tetrakis(3,4,5-trimethoxyphenyl)1,2'-bisimidazole, and 2,2'-bis(o-chlorophenyl)-4,5,4',5'-tetraphenyl-1,2'-bisimidazole, etc. The titanocene compounds include dicyclopentadienyl-titanium-dichloride, dicyclopentadienyl-titanium-bisphenyl, dicyclopentadienyl-titanium-bis(2,3,4,5,6-pentafluorophenyl), dicyclopentadienyl-titanium-bis(2,3,5,6-tetrafluorophenyl), dicyclopentadienyl-titanium-bis(2,4,6-trifluorophenyl), dicyclopentadienyl-titanium-bis(2,6-difluorophenyl), dicyclopentadienyl-titanium-bis(2,4-difluorophenyl), bis(methylcyclopentadienyl)-titanium-bis(2,3,4,5,6-pentafluorophenyl), bis(methylcyclopentadienyl)-titanium-bis(2,3,5,6-tetrafluorophenyl), bis(methylcyclopentadienyl)-titanium-bis(2,6-difluorophenyl), and dicyclopentadienyl-titanium-bis(2,6-difluoro-3-(1H-pyrrol-1-yl)-phenyl), etc.

The photo-radical polymerization initiator also includes 1,3-di(tert-butyldioxycarbonyl)benzophenone, 3,3',4,4'-tetrakis(tert-butyldioxycarbonyl)benzophenone, 3-phenyl-5-isooxazolone, 2-mercaptobenzimidazole, 2,2-dimethoxy-1,2-diphenylethane-1-one, 1-hydroxy-cyclohexyl-phenyl-ketone, and 2-benzyl-2-dimethylamino-1-(4-morpholinophenyl)-butane, etc.

The photo-cationic polymerization initiator includes sulfonic acid esters, sulfonimide compounds, disulfonyldiazomethane compounds, dialkyl-4-hydroxysulfonium salts, arylsulfonic acid-p-nitrobenzyl ester, silanol-aluminum complex, (η6-benzene)(η5-cyclopentadienyl)iron (II), etc.

The sulfonimide compounds include for example N-(trifluoromethanesulfonyloxy)succinimide, N-(nonafluoro-n-butanesulfonyloxy)succinimide, N-(camphorsulfonyloxy)succinimide and N-(trifluoromethanesulfonyloxy)naphthalimide, etc.

The disulfonyldiazomethane compounds include for example bis(trifluoromethylsulfonium)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane, etc.

The photo-cationic polymerization initiator also includes 2-methylthiophenyl)-2-morpholinopropane-1-one.

In addition, aromatic iodonium salt compounds, aromatic sulfonium salt compound, aromatic diazonium salt compounds, aromatic phosphonium salt compounds, triazine compounds and iron arene complex compounds, etc. can be used as both the photo-radical polymerization initiator and the photo-cationic polymerization initiator.

The aromatic iodonium salt compounds include diphenyliodonium hexafluorophosphate, diphenyliodonium trifluoromethane sulfonate, diphenyliodonium nanofluoro-n-butane sulfonate, diphenyliodonium perfluoro-n-octane sultanate, diphenyliodonium camphor sulfonate, bis(4-tert-butylphenyl)iodonium camphor sulfonate and bis(4-tert-butylphenyl)iodonium trifluoromethane sulfonate, etc.

The aromatic sulfonium salt compound include for example triphenylsulfonium hexafluoroantimonate, triphenylsulfonium nonafluoron-butanesulfonate, triphenylsulfonium camphor sulfonate and triphenylsulfonium trifluoromethane sulfonate, etc.

In the underlayer coating forming composition of the present invention, the photopolymerization initiator can be used solely or in combination of two or more kinds.

The content of the polymerizable substance and the photopolymerization initiator in the underlayer coating forming composition of the present invention is as follows. The content of the photopolymerization initiator is for example 1 to 20 mass parts or 3 to 10 mass parts based on 100 mass parts of the polymerizable substance. When the content of the photopolymerization initiator is less than the lower limit, the polymerization does not proceed sufficiently, the hardness and wear resistance of the underlayer coating often become insufficient. When the content of the photopolymerization initiator is more than the upper limit, hardening occurs only at the vicinity of the surface of the underlayer coating, and thus it often becomes difficult to cure completely to the inside of the underlayer coating.

When the compound having ethylenically unsaturated bond being radical polymerizable moiety is used as a polymerizable substance in the underlayer coating forming composition of the present invention, the photo-radical polymerization initiator is preferably used as a photopolymerization initiator. When the compound having vinyl ether structure, epoxy ring or oxetane ring being cationic polymerizable moiety is used as a polymerizable substance, the photo-cationic polymerization initiator is preferably used as a photopolymerization initiator.

The underlayer coating forming composition of the present invention can contain in addition to the above-mentioned polymerizable substance and photopolymerization initiator, surfactants, sensitizers, amine compounds, polymer compounds, antioxidants, heat polymerization inhibitors, surface modifiers and defoamers, etc., if necessary.

The addition of the surfactants can lead to inhibition of occurrence of pinholes or striation, etc., and to improvement in the application property of the underlayer coating forming composition. The surfactants include for example, polyoxyethylene alkyl ether compounds such as polyoxyethylene lauryl ether, polyoxyethylene stearyl ether and polyoxyethylene oleyl ether, etc., polyoxyethylene alkyl aryl ether compounds such as polyoxyethylene octyl phenol ether and polyoxyethylene nonyl phenol ether, etc., polyoxyethylene/polyoxypropylene block copolymer compounds, sorbitan fatty acid ester compounds such as sorbitan monolaurate, sorbitan monopalmitate, sorbitan monostearate, sorbitan monooleate, sorbitan trioleate and sorbitan tristearate, etc., polyoxyethylene sorbitan fatty acid ester compounds such as polyoxyethylene sorbitan monolaurate, polyoxyethylene sorbitan monopalmitate, polyoxyethylene sorbitan monostearate and polyoxyethylene sorbitan tristearate, etc. The surfactants also include fluorine based surfactants, e.g., trade name: EFTOP EF301, EF303, EF352 (manufactured by Jemco Inc.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); and organosiloxane polymer KP341 (manufactured by Shin-Etsu Chemical Co., Ltd.), etc. When the surfactant is used, the added amount is for example 0.1 to 5 mass parts or 0.5 to 2 mass parts based on 100 mass parts of the polymerizable substance.

The sensitizers can be used in order to increase the sensitivity of the photopolymerization initiator to light. The sensitizers include for example pyrromethene complex compounds such as 2,6-diethyl-1,3,5,7,8-pentamethyl pyrromethene-$BF_2$ complex and 1,3,5,7,8-pentamethyl pyrromethene-$BF_2$ complex, etc., xanthene type coloring matters such as eosin, ethyleosin, erythrosin, fluorescein and rose bengal, etc., ketothiazorine compounds such as 1-(1-methylnaphtho[1,2-d]thiazole-2(1H)-ylidene-4-(2,3,6,7)tetrahydro-1H,5H-benzo[ij]quinolidine-9-yl)-3-butene-2-one, 1-(3-methylbenzothiazole-2(3H)-ylidene-4-(p-dimethylaminophenyl)-3-butene-2-one, etc., styryl or phenylbutadienyl heterocyclic compounds such as 2-(p-dimethylaminostyryl)-naphtho[1,2-d]thiazole, 2-[4-(p-dimethylaminophenyl)-1,3-butadienyl]-naphtho[1,2-d]thiazole, etc. In addition, 2,4-diphenyl-6-(p-dimethylaminostyryl)-1,3,5-triazine, 2,4-diphenyl-6-(([2,3,6,7]tetrahydro-1H,5H-benzo[ij]quinolidine-9-yl)-1-ethene-2-yl)-1,3,5-triazonenanthryl-(([2,3,6,7]tetrahydro-1H,5H-benzo[ij]quinolidine-9-yl)-1-ethene-2-yl)ketone and 2,5-bis(p-dimethylaminocinnamylidene)cyclopentanone, 5,10,15,20-tetraphenylporphyrin, etc. can be mentioned. When the sensitizer is used, the added amount is for example 0.1 to 20 mass parts based on 100 mass parts of the polymerizable substance.

The amine compounds can be used in order to prevent lowering in sensitivity due to oxygen inhibition of the photopolymerization initiator. As the amine compounds, several amine compounds such as aliphatic amine compounds and aromatic amine compounds, etc. can be used. When the amine compound is used, the added amount is for example 0.1 to 10 mass parts based on 100 mass parts of the polymerizable substance.

The use of the polymer compound enables the control of refractive index, attenuation coefficient, and light absorbing property, etc. of the underlayer coating formed from the underlayer coating forming composition of the present invention. For example, the use of polymer compounds having benzene ring can enable an increase in the light absorbing property of the underlayer coating to ArF excimer laser beam (wavelength 193 nm). In addition, for example, the use of polymer compounds having naphthalene ring or anthracene ring can enable an increase in the light absorbing property of the underlayer coating to KrF excimer laser beam (wavelength 248 nm).

As the polymer compounds, several polymer compounds having a weight average molecular weight (in terms of standard polystyrene) of about 1000 to 1000000 can be used without any limitation to the kind. For example, acrylate polymers, methacrylate polymers, novolak polymers, styrene polymers, polyamides, polyamic acids, polyesters and polyimides having benzene ring, naphthalene ring or anthracene ring, etc. can be mentioned.

The polymer compounds excellent in light absorbing property that are used for anti-reflective coatings being an underlayer of photoresists in the lithography process of the manufacture of semiconductor devices can be also used. The use of such polymer compounds can enable an increase in performances as anti-reflective coatings of the underlayer coatings formed from the underlayer coating forming composition of the present invention.

When the polymer compound is used, the added amount is for example 0.1 to 50 mass parts based on 100 mass parts of the polymerizable substance.

The underlayer coating forming composition of the present invention is preferably used in a solution state in which each component (hereinafter referred to as "solid content") is dissolved in a solvent. As the solvent, any solvents can be used as far as the solvents can dissolve the solid contents to give a homogeneous solution. The solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N-dimethylformamide, N-dimethylacetamide, dimethylsulfoxide and N-methylpyrrolidone, etc. These solvents may be used solely or in combination of two or more kinds. The solvents having a boiling point of 80 to 250° C., or 100 to 200° C., or 120 to 180° C. are preferably used. When the boiling point of the solvent is less than the above-mentioned lower limit, the vaporization of a large amount of the solvent during the application of the underlayer coating forming composition often causes an increase in viscosity and a lowering of application property. When the boiling point of the solvent is more than the above-mentioned upper limit, is assumed to require a long time for drying after the application of the underlayer coating forming composition. The solvent can be used in an amount so that the solid content in the underlayer coating forming composition can be for example 0.5 to 50 mass %, or 3 to 40 mass %, or 10 to 30 mass %.

Hereinafter, the use of the underlayer coating forming composition of the present invention is explained.

The underlayer coating forming composition of the present invention is coated by a suitable coating method, for example, with a spinner, a coater or the like, onto a semiconductor substrate (for example silicon/silicon dioxide coated substrate, silicon wafer substrate, silicon nitride substrate, glass substrate, ITO substrate, polyimide substrate and low-k material-coated substrate, etc.) to form an applied coating. Then, prior to light irradiation, a drying process can be performed, if necessary. When the underlayer coating forming composition containing a solvent is used, it is preferable to perform a drying process.

The drying process is not specifically limited so long as heating at a high temperature is not carried out in the process. This is because it is assumed that heating at a high temperature (for example a temperature of 150° C. or more) causes sublimation of the solid content contained in the applied coating that pollutes the apparatuses. The drying process can be performed by for example heating a substrate at 50 to 100° C. for 0.1 to 10 minutes on a hot plate. The drying process can be also performed by air-drying at room temperature (about 20° C.).

Then, light irradiation is performed to the applied coating. For the light irradiation, any methods can be used without any limitation so long as it can act to the above-mentioned photopolymerization initiator and cause the polymerization of the polymerizable substance. The light irradiation can be performed by use of light having a wavelength of 150 nm to 1000 nm, or 193 nm to 700 nm, or 300 nm to 600 nm. For example, the light irradiation can be performed with an ultrahigh pressure mercury lamp, a flash UV lamp, a high pressure mercury lamp, a low pressure mercury lamp, a DEEP-UV lamp, a xenon short arc lamp, a short arc metal halide lamp, a YAG laser excitation lamp, and xenon flash lamp, etc. For example, an ultrahigh pressure mercury lamp is used, irradiation with light of whole wavelength ranging from about 250 nm to 650 nm including bright line spectrum having the following wavelength as peaks: 289 nm, 297 nm, 303 nm, 313 nm (j-line), 334 nm and 365 nm (i-line) belonging to ultraviolet region, and 405 nm (h-line), 436 nm (g-line), 546 nm and 579 nm belonging to visible ray region can be performed.

The light irradiation causes the formation of cation species active radials from the photopolymerization initiator in the applied coating, and thereby the polymerization of the polymerizable substance in the applied coating occurs. As a result of the polymerization, an underlayer coating is formed. The resulting underlayer coating becomes low in solubility in a solvent used for photoresist composition applied thereon, for example, ethylene glycol monomethyl ether, ethyl cellosolve acetate, diethylene glycol monomethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxy acetate, methyl pyruvate, ethyl lactate, butyl lactate, and the like. Therefore, an underlayer coating formed by the underlayer coating forming composition of the present invention do not intermix with the photoresist.

Figure 1:
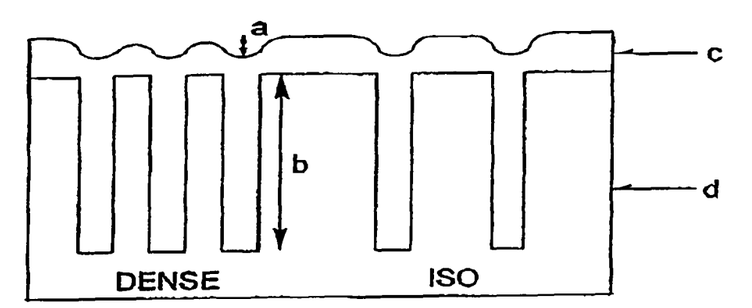
FIG. 1 is a sectional view of an underlayer coating formed on a semiconductor substrate having holes.

The underlayer coating forming composition of the present invention can be applied on a semiconductor having holes of an aspect ratio shown in height/diameter of 1 or more, for example 1 to 10, or 2 to 5 as shown in FIG. 1. And, the underlayer coating forming composition of the present invention can be used for filling the holes without gap (void) with an underlayer coating. The underlayer coating forming composition of the present invention can be also applied on a semiconductor substrate having holes of an aspect ratio of 1 or more densely and thinly (a substrate containing a part having holes densely and a part having holes thinly). Further, the underlayer coating forming composition of the present invention can be used for forming a flat underlayer coating on a substrate on which such holes are present densely and thinly.

In addition, the underlayer coating forming composition of the present invention can be used also for a semiconductor having holes of an aspect ratio less than 1, and a semiconductor having unevenness. Further, it can be used also for a semiconductor having no unevenness and the like.

The underlayer coating formed from the underlayer coating forming composition of the present invention has a film thickness of for example 20 to 2000 nm, or 30 to 1000 nm, or 50 to 800 nm on the surface of a substrate.

Next, a photoresist is formed on the underlayer coating. Consequently, a laminate structure constituting of an underlayer coating and a photoresist is formed on a semiconductor substrate. The photoresist is formed by the known method, namely, by applying a photoresist composition solution onto the underlayer coating, and by heating. The photoresist to be formed on the underlayer coating of the present invention is not specifically limited, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an add and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shin-Etsu Chemical Co., Ltd., and the like can be mentioned.

Subsequently, exposure to light is carried out through a predetermined mask. For the exposure to light, KrF excimer laser (wavelength of 248 nm), ArF excimer laser (wavelength of 193 nm), and F2 excimer laser beam (wavelength 157 nm), may be used. If necessary, a post exposure bake may be performed after being exposed to light. The post exposure bake is conducted by suitably selecting from heating temperature of 70 to 150° C., and a heating time of 0.3 to 10 minutes.

In the next phase, development is carried out by using a developer. For example, in case where a positive type photoresist is used, the development results in removal of exposed part of the photoresist and forming of photoresist pattern.

The developer for photoresist includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, choline or the like, amine aqueous solution such as ethanolamine, propylamine, ethylenediamine or the like. Additionally, surfactants can be added in the developer. The condition in which development takes place is suitably selected from a temperature ranging from 5 to 50° C. and time ranging from 0.1 to 5 minutes.

Then, the removal of the underlayer coating and processing of the semiconductor substrate are conducted by using the photoresist pattern formed as mentioned above as a protective coating. The removal of the underlayer is conducted through dry etching by use of a gas such as tetrafluoromethane ($CF_4$), perfluorocyclobutane ($C_4F_8$), perfluoropropane ($C_3F_8$), trifluoromethane, carbon monooxide, argon, oxygen, nitrogen, sulfur hexafluoride, difluoromethane, nitrogen trifluoride, and chlorine trifluoride, etc. The removal of the underlayer coating leads to the formation of a pattern consisting of an underlayer coating and a photoresist on a semiconductor substrate.

In addition, an anti-reflective coating layer can be formed before forming a photoresist on the underlayer coating of the present invention. The anti-reflective coating composition is not specifically limited, and any existing compositions can be used. For example, an anti-reflective coating can be formed by coating an anti-reflective coating forming composition conventionally used in the lithography process with the conventional method, for example, with a spinner or a coater, and baking. The anti-reflective coating composition includes for example one containing as main components a light absorbing compound, a resin and a solvent, one containing as main components a resin having a light absorbing group through chemical bond, a crosslinking agent and a solvent, one containing as main components a light absorbing compound, a crosslinking agent and a solvent, and one containing as main components a polymer type crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The resins include polyesters, polyimides, polystyrenes, novolak resins, polyacetals, acrylic polymers, and the like. The resins having a light absorbing group through chemical bond include resins having a light absorbing aromatic ring structure such as anthracene ring, naphthalene ring, benzene ring, quinoline ring, quinoxaline ring or thiazole ring.

Further, prior to coating of the underlayer coating forming composition of the present invention, an anti-reflective coating or a flattening coating can be formed on a semiconductor substrate.

The underlayer coating formed by the underlayer coating forming composition of the present invention may have absorption for light used in the process of lithography. In such a case, the underlayer coating can be used as a layer that provides preventive effect towards the light reflected by the substrate, that is, as an anti-reflective coating. The underlayer coating of the present invention can be used further as a layer for preventing an interaction between the substrate and the photoresist, as a layer having a function that prevents an adverse effect against the semiconductor substrate by the material used for the photoresist or by substances formed on exposure to light of the photoresist, and as a layer having a function that prevents diffusion of substances formed in the semiconductor substrate on baking under heating to the upper layer photoresist, and the like.

Hereinafter, the present invention will be described based on examples but the present invention is not limited thereto.

EXAMPLES

Example 1

In 25.87 g of propylene glycol monomethyl ether, 5 g of a photopolymerization compound: pentaerythritol tetramethacrylate (manufactured by Sigma-Aldrich Japan K.K., trade name: FW352), 0.25 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 μm to prepare a solution of an underlayer coating forming composition.

Example 2

In 25.87 g of propylene glycol monomethyl ether, 5 g of a photopolymerization compound: bis(4-glycidyloxyphenyl)methane (manufactured by Sigma-Aldrich Japan K.K., trade name: FW312), 0.25 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 μm to prepare a solution of an underlayer coating forming composition.

Example 3

In 27.10 g of propylene glycol monomethyl ether, 5 g of a photopolymerization compound: bisphenol-A-propoxylate diglycidyl ester (manufactured by Sigma-Aldrich Japan K.K., trade name: FW457), 0.50 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 μm to prepare a solution of an underlayer coating forming composition.

Example 4

In 25.87 g of propylene glycol monomethyl ether, 5 g of a photopolymerization compound: pentaerythritol trimethacrylate (manufactured by Sigma-Aldrich Japan K.K., trade name: FW282), 0.25 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 μm to prepare a solution of an underlayer coating forming composition.

Example 5

In 25.87 g of propylene glycol monomethyl ether, 5 g of a photopolymerization compound: bisphenol-A-glycerolate dimethacrylate (manufactured by Sigma-Aldrich Japan K.K., trade name: FW484), 0.25 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 μm to prepare a solution of an underlayer coating forming composition.

Example 6

In 25.87 g of propylene glycol monomethyl ether, 5 g of a photopolymerization compound: poly(propyleneglycol)diglycidyl ether (manufactured by Sigma-Aldrich Japan K.K., trade name: FW150), 0.25 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30)

were added to prepare a solution of 17 mass % (solid content concentration). Then, the solution was filtered through a micro filter made of polyethylene having a pore size of 0.2 µm to prepare a solution of an underlayer coating forming composition.

Example 7

In 25.87 g of propylene glycol monomethyl ether, 5 g of a photopolymerization compound: pentaerythritol tetraglycidyl ether (manufactured by Nagase Chemtex Corporation, trade name: EX411), 0.25 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 µm to prepare a solution of an underlayer coating forming composition.

Example 8

In 25.87 g of propylene glycol monomethyl ether, 5 g of a photopolymerization compound: 3,4-epoxycyclohexylmethyl-3,4-epoxycyclohexane carboxylate (manufactured by Daicel Chemical Industries Ltd., trade name: Ceroxide2021), 0.25 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 µm to prepare a solution of an underlayer coating forming composition.

Example 9

In 25.87 g of ethyl lactate, 5 g of a photopolymerization compound: 3,4-epoxycyclohexylmethyl-3,4-epoxycyclohexane carboxylate (manufactured by Daicel Chemical Industries Ltd., trade name: Ceroxide2021), 0.25 g of a photopolymerization initiator: 2-methyl-1-(4-methylthiophenyl)-2-morpholinopropane-1-one (manufactured by Chiba Specialty Chemicals, trade name: Irgacure907) and 0.05 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 µm to prepare a solution of an underlayer coating forming composition.

Example 10

In 26.61 g of cyclohexanone, 26.61 g of ethyl lactate, photopolymerization compounds: 5 g of 3,4-epoxycyclohexylmethyl-3,4-epoxycyclohexane carboxylate (manufactured by Daicel Chemical Industries Ltd., trade name: Ceroxide2021) and 5 g of di((3-ethyl-3-oxetanyl)methyl)ether (formula (41), manufactured by Toagosei Co., Ltd., trade name: OXT221), 0.8 g of a photopolymerization initiator: 2-methyl-1-(4-methylthiophenyl)-2-morpholinopropane-1-one (manufactured by Chiba Specialty Chemicals, trade name: Irgacure907) and 0.1 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 µm to prepare a solution of an underlayer coating forming composition.

Example 11

In 26.61 g of cyclohexanone, 26.61 g of ethyl lactate, photopolymerization compounds: 5 g of 3,4-epoxycyclohexylmethyl-3,4-epoxycyclohexane carboxylate (manufactured by Daicel Chemical Industries Ltd., trade name: Ceroxide2021) and 5 g of 3-ethyl-3-(2-ethylhexyloxymethyl)oxetane (formula (41), manufactured by Toagosei Co., Ltd., trade name: OXT221), 0.8 g of a photopolymerization initiator: triphenylsulfonium trifluoromethane sulfonate (manufactured by Midori Kagaku Co., Ltd., trade name: TPS105) and 0.10 g of a surfactant (manufactured by Dainippon Ink and Chemicals Incorporated, trade name: Megafac R-30) were added to prepare a solution of 17 mass % (solid content concentration). Then, the solution was filtered through a micro filter made of polyethylene having a pore size of 0.2 µm to prepare a solution of an underlayer coating forming composition.

Synthesis Example 1

In 216 g of ethyl lactate, 30.0 g of glycidylmethacrylate (manufactured by Tokyo Kasei Kogyo Co., Ltd.) and 24.1 g of methyl methacrylate were dissolved, and nitrogen was flowed in the solution for 30 minutes, the solution was then heated up to 70° C. While keeping the reaction solution at 70° C., 1.62 g of azobisisobutyronitrile and 1.62 g of 1-dodecane thiol were added to the reaction solution. After stirring the solution at 70° C. for 8 hours under nitrogen atmosphere, 0.1 g of 4-methoxyphenol was added to obtain a solution containing a copolymer of glycidylmethacrylate and methylmethacrylate. The obtained copolymer was analyzed by GPC method, and the number average molecular weight (Mn) of the copolymer was 6000, and the weight average molecular weight (Mw) (in terms of standard polystyrene) of the copolymer was 12000.

Synthesis Example 2

In 109.5 g of ethyl lactate, 15.0 g of glycidylmethacrylate (manufactured by Tokyo Kasei Kogyo Co., Ltd.), 6.19 g of benzylmethacrylate and 5.98 g of γ-butyrolactone methacrylate (manufactured by Osaka Organic Chemical Industry Ltd.) were dissolved, and nitrogen was flowed in the solution for 30 minutes, the solution was then heated up to 70° C. While keeping the reaction solution at 70° C., 0.210 g of azobisisobutyronitrile was added to the reaction solution. After stirring the solution at 70° C. for 8 hours under nitrogen atmosphere, 0.1 g of 4-methoxyphenol was added to obtain a solution containing a copolymer of glycidylmethacrylate, benzylmethacrylate and γ-butyrolactone methacrylate. The obtained copolymer was analyzed by GPC method, and the number average molecular weight (Mn) of the copolymer was 9000, and the weight average molecular weight (Mw) (in terms of standard polystyrene) of the copolymer was 15000.

Example 12

In 55.4 g of ethyl lactate, 50 g of the solution containing a copolymer of glycidylmethacrylate and methylmethacrylate obtained in Synthesis Example 1 (solid content concentration: 20.0%), 0.50 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 10 mass % (solid content concentration). Then, the solution was filtered through a micro filter made of polyethylene having a pore size of 0.2 µm to prepare a solution of an underlayer coating forming composition.

Example 13

In 55.4 g of ethyl lactate, 50 g of the solution containing a copolymer of glycidylmethacrylate, benzylmethacrylate and γ-butyrolactone methacrylate obtained in Synthesis Example 2 (solid content concentration: 20.0%), 0.50 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 10 mass % (solid content concentration). Then, the solution was filtered through a micro filter made of polyethylene having a pore size of 0.2 µm to prepare a solution of an underlayer coating forming composition.

Example 14

In 95.4 g of ethyl lactate, 10 g of an alicyclic solid epoxy resin EHPE (manufactured by Daicel Chemical Industries Ltd., corresponding to formula (15)) (solid content concentration: 100.0%), 0.50 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 10 mass % (solid content concentration). Then, the solution was filtered through a micro filter made of polyethylene having a pore size of 0.2 µm to prepare a solution of an underlayer coating forming composition.

Example 15

In 95.4 g of ethyl lactate, 10 g of an epoxy novolak resin DEN438 (manufactured by Dow Chemical Japan Limited, corresponding to formula (33)) (solid content concentration: 100.0%), 0.50 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 10 mass % (solid content concentration). Then, the solution was filtered through a micro filter made of polyethylene having a pore size of 0.2 µm to prepare a solution of an underlayer coating forming composition.

Example 16

In 95.4 g of ethyl lactate, 10 g of a bromated epoxy novolak resin BREN304 (manufactured by Nippon Kayaku Co., Ltd., corresponding to formula (39)) (solid content concentration: 100.0%), 0.50 g of a photopolymerization initiator: triphenylsulfonium trifluoromethane sulfonate (manufactured by Midori Kagaku Co., Ltd., trade name: TPS105) and 0.05 g of a surfactant (manufactured by Dainippon Ink and Chemicals Incorporated, trade name: Megafac R-30) were added to prepare a solution of 10 mass % (solid content concentration). Then, the solution was filtered through a micro filter made of polyethylene having a pore size of 0.2 µm to prepare a solution of an underlayer coating forming composition.

Dissolution Test in Photoresist Solvent

The solutions of underlayer coating forming compositions obtained in Examples 1 to 11 were coated on semiconductor substrates (silicon wafer substrates) by means of a spinner, respectively, to form applied coatings. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings (film thickness 600 nm). The underlayer coatings were dipped in ethyl lactate and propylene glycol monomethyl ether being solvents used for photoresists, and as a result it was confirmed that the resulting underlayer coatings were insoluble in these solvents.

In addition, the solutions of underlayer coating forming compositions obtained in Examples 12 to 16 were coated on semiconductor substrates (silicon wafer substrates) by means of a spinner, respectively, to form applied coatings. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings (film thickness 600 nm). The underlayer coatings were dipped in ethyl lactate and propylene glycol monomethyl ether being solvents used for photoresists, and as a result it was confirmed that the resulting underlayer coatings were insoluble in these solvents.

Test of Intermixing with Photoresist

The solutions of underlayer coating forming compositions obtained in Examples 1 to 11 were coated on silicon wafer substrates by means of a spinner, respectively, to form applied coatings. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings (film thickness 600 nm). On each underlayer coating was coated a commercially available photoresist solution (manufactured by Shipley Company, trade name: APEX-E) by means of a spinner. The coated wafers were heated at 90° C. for 1 minute on a hot plate. After exposure of the photoresists to light, post exposure bake was performed at 90° C. for 1.5 minute. After developing the photoresists, the film thickness of the underlayer coatings was measured and it was confirmed that no intermixing occurred between the underlayer coatings formed from the solutions of Examples 1 to 11 and the photoresists.

The solutions of underlayer coating forming compositions obtained in Examples 12 to 16 were coated on silicon wafer substrates by means of a spinner, respectively, to form applied coatings. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings (film thickness 200 nm). On each underlayer coating was coated a commercially available photoresist solution (manufactured by Shipley Company, trade name: APEX-E) by means of a spinner. The coated wafers were heated at 90° C. for 1 minute on a hot plate. After exposure of the photoresists to light, post exposure bake was performed at 90° C. for 1.5 minute. After developing the photoresists, the film thickness of the underlayer coatings was measured and it was confirmed that no intermixing occurred between the underlayer coatings formed from the solutions of Examples 12 to 16 and the photoresists.

Tests of Flattening Rate and Filling Property

The solutions of underlayer coating forming compositions obtained in Examples 1 to 11 were coated on silicon dioxide (SiO$_2$ wafer) substrates having holes (diameter: 0.18 μm, depth: 1.0 μm) by means of a spinner, respectively. The used substrates were substrates having Iso (isolated) and Dense (dense) patterns of holes as shown in FIG. 1. Iso pattern is a pattern in which the distance from the center of a hole to the center of the adjacent hole is five times as long as the diameter of the hole. Denso pattern is a pattern in which the distance from the center of a hole to the center of the adjacent hole is one time as long as the diameter of the hole. The depth of the holes is 1.0 μm and the diameter thereof is 0.18 μm.

In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings. The thickness of coating thereof was 0.60 μm at the open area where hole pattern is not present in the vicinity. The flattening rate by the underlayer coatings was assessed by observing the sectional form of the substrates with a scanning electron microscope (SEM).

The solutions of underlayer coating forming compositions obtained in Examples 12 to 16 were coated on silicon dioxide (SiO$_2$ wafer) substrates having holes (diameter: 0.10 μm, depth: 0.6 μm) by means of a spinner, respectively. The used substrates were substrates having Iso (isolated) and Dense (dense) patterns of holes as shown in FIG. 1. Iso pattern is a pattern in which the distance from the center of a hole to the center of the adjacent hole is five times as long as the diameter of the hole. Denso pattern is a pattern in which the distance from the center of a hole to the center of the adjacent hole is one time as long as the diameter of the hole. The depth of the holes is 0.6 μm and the diameter thereof is 0.10 μm.

In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings. The thickness of coating thereof was 0.20 μm at the open area where hole pattern is not present in the vicinity. The flattening rate by the underlayer coatings was assessed by observing the sectional form of the substrates with a scanning electron microscope (SEM).

The flattening rate was calculated according to the following equation. The flattening rate was 100% when holes on the substrate were perfectly flattened. The results are shown in Tables 1 and 2.

Flattening Rate=[1−(dimple depth $a$ of underlayer coating at the center of holes)/(hole depth $b$)]×100

In addition, no void (gap) was observed inside the holes, and it was observed that the inside of the holes was filled with the underlayer coating.

TABLE 1

| | Film Thickness (nm) | | | Flattening Rate (%) | | |
|---|---|---|---|---|---|---|
| | Iso | Dense | Bias | Iso | Dense | Bias |
| Example 1 | 600 | 500 | 100 | 100 | 100 | 0 |
| Example 2 | 600 | 500 | 100 | 100 | 100 | 0 |
| Example 3 | 600 | 500 | 100 | 100 | 100 | 0 |
| Example 4 | 600 | 550 | 50 | 100 | 100 | 0 |
| Example 5 | 600 | 500 | 100 | 100 | 100 | 0 |
| Example 6 | 610 | 550 | 60 | 100 | 100 | 0 |
| Example 7 | 600 | 500 | 100 | 100 | 100 | 0 |
| Example 8 | 630 | 590 | 40 | 100 | 100 | 0 |
| Example 9 | 590 | 530 | 60 | 100 | 100 | 0 |
| Example 10 | 610 | 610 | 0 | 100 | 100 | 0 |
| Example 11 | 600 | 560 | 40 | 100 | 100 | 0 |

TABLE 2

| | Film Thickness (nm) | | | Flattening Rate (%) | | |
|---|---|---|---|---|---|---|
| | Iso | Dense | Bias | Iso | Dense | Bias |
| Example 12 | 200 | 150 | 50 | 100 | 100 | 0 |
| Example 13 | 200 | 140 | 60 | 100 | 100 | 0 |
| Example 14 | 210 | 160 | 50 | 100 | 100 | 0 |
| Example 15 | 200 | 150 | 50 | 100 | 100 | 0 |
| Example 16 | 200 | 150 | 50 | 100 | 100 | 0 |

In the underlayer coatings of Examples 1 to 16, difference (Bias) in film thickness on Iso (isolated) and Dense (dense) patterns was small. The underlayer coatings of Examples 1 to 16 were excellent in flowability on fine Dense hole pattern that it was particularly difficult to obtain a constant film thickness. It is assumed that the solution of the underlayer coating forming composition smoothly flows into a plurality of holes even at Dense part having larger hole number (hole density) per unit area on the substrate than Iso part, thereby providing constant film thickness, and that consequently difference in film thickness of Iso part and Dense part becomes small and flattening rate becomes high. Further, the underlayer coating forming compositions of Examples 1 to 16 were able to flatten irrespective of Iso part and Dense part.

Measurements of Optical Parameters

The solution of underlayer coating forming composition obtained in Example 1 was coated on a silicon wafer substrate by means of a spinner to form an applied coating. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings (film thickness 600 nm). On the underlayer coating, refractive index (n) and attenuation coefficient (k) at a wavelength of 193 nm were measured with a spectroscopic ellipsometer. As a result, refractive index (n) was 1.69 and attenuation coefficient (k) was 0.096.

Underlayer coatings were formed from the solutions of underlayer coating forming compositions obtained in Examples 9 and 10 similarly to the above. On the underlayer coatings, refractive index (n) and attenuation coefficient (k) at a wavelength of 193 nm were measured with a spectroscopic ellipsometer. The underlayer coating formed from the solution of Example 9 had a refractive index (n) of 1.68 and attenuation coefficient (k) of 0.038. The underlayer coating formed from the solution of Example 10 had a refractive index (n) of 1.67 and and attenuation coefficient (k) of 0.087.

The solution of underlayer coating forming composition prepared in Example 12 was coated on a silicon wafer substrate by means of a spinner to form an applied coating. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY output: 500 W) for 3 minutes under a condition in which whole wavelength of the lamp is irradiated at 6.0 mW (an exposure value of 1080 mJ/cm$^2$) to form underlayer coatings (film thickness 200 nm). On the underlayer coating, refractive index (n) and attenuation coefficient (k) at a wavelength of 193 nm were measured with a spectroscopic ellipsometer. As a result, refractive index (n) was 1.70 and attenuation coefficient (k) was 0.020.

An underlayer coating was formed from the solution of underlayer coating forming compositions prepared in Example 13 similarly to the above. On the underlayer coating, refractive index (n) and attenuation coefficient (k) at a wavelength of 193 nm were measured with a spectroscopic ellipsometer. As a result, the underlayer coating from Example 13 had a refractive index (n) of 1.79 and an attenuation coefficient (k) of 0.31.

Test of Dry Etching Rate

The solutions of underlayer coating forming compositions obtained in Examples 1, 3, 5, 7, 9 and 10 were coated on silicon wafer substrates by means of a spinner, respectively, to form applied coatings. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings (film thickness 0.6 μm). Then, dry etching rate (decrease in film thickness per unit time) on these underlayer coatings was measured with RIE system ES401 manufactured by Nippon Scientific Co., Ltd. under the condition in which tetrafluoromethane was used as dry etching gas. The results are shown in Table 3. In the table, the selectivity corresponds to dry etching rate of an underlayer coating in case where the dry etching rate of the photoresist for KrF laser lithography (trade name: SEPR430 manufactured by Shin-Etsu Chemical Co., Ltd.) under a similar condition as above is regarded as 1.00.

The solutions of underlayer coating forming compositions obtained in Examples 12 to 16 were coated on silicon wafer substrates by means of a spinner, respectively, to form applied coatings. In order to remove the solvent and dry, the substrates were heated at 100° C. for 1 minute on a hot plate. Then, the applied coatings were irradiated with an ultrahigh pressure mercury lamp (manufactured by Ushio Inc., type UIS-5011MIKY, output: 500 W) for 3 minutes under a condition in which whole wavelength of the lamp is irradiated at 6.0 mW (an exposure value of 1080 mJ/cm$^2$) to form underlayer coatings (film thickness 0.2 μm). Then, dry etching rate (decrease in film thickness per unit time) on these underlayer coatings was measured with RIE system ES401 manufactured by Nippon Scientific Co., Ltd. under the condition in which tetrafluoromethane was used as dry etching gas. The results are shown in Table 4. In the table, the selectivity corresponds to dry etching rate of an underlayer coating in case where the dry etching rate of the photoresist for KrF laser lithography (trade name: SEPR430 manufactured by Shin-Etsu Chemical Co., Ltd.) under a similar condition as above is regarded as 1.00.

TABLE 3

|  | Selectivity |
| --- | --- |
| Example 1 | 1.82 |
| Example 3 | 1.05 |
| Example 5 | 1.10 |
| Example 7 | 1.89 |
| Example 9 | 1.49 |
| Example 10 | 1.37 |

TABLE 4

|  | Selectivity |
| --- | --- |
| Example 12 | 1.63 |
| Example 13 | 1.52 |
| Example 14 | 1.39 |
| Example 15 | 1.12 |
| Example 16 | 1.33 |

It was confirmed that the etching rate of the underlayer coatings obtained from the underlayer coating forming compositions of Examples 1, 3, 5, 7, 9 and 10 and Examples 12 to 16 was higher that of the photoresists. This result means that in the process in which the base of the substrate is exposed after development of the photoresist formed on the underlayer coating, the underlayer coating is removed before the photoresist is scraped out. That is, it is suggested that the developed photoresist pattern can be transferred to a substrate accurately.

DESCRIPTION OF SYMBOL

Symbol a is dimple depth of the underlayer coating at the center of the hole. Symbol b is depth of initial hole on the semiconductor substrate used. Symbol c is the underlayer coating. Symbol d is the semiconductor substrate.

The invention claimed is:
1. A method for forming an underlayer coating used as an underlayer of a photoresist in a lithography process for the manufacture of semiconductor devices, comprising:
applying an underlayer coating forming composition on a semiconductor substrate to form an applied coating, the underlayer coating forming composition comprising:
a polymerizable compound having at least one radical polymerizable ethylenically unsaturated bond, and
a photo-radical polymerization initiator, wherein the polymerizable compound having at least one radical polymerizable ethylenically unsaturated bond is a member selected from the group consisting of
an unsaturated carboxylic acid compound,
an unsaturated carboxylic acid amide compound, a urethane compound that is obtained by reaction between a polyvalent isocyanate compound and a hydroxyalkyl unsaturated carboxylic acid ester compound,
a compound that is obtained by reaction between a polyvalent epoxy compound and a hydroxyalkyl unsaturated carboxylic acid ester compound,
a diallyl ester compound, and
a divinyl compound; and
irradiating the applied coating with light to form an underlayer coating; wherein
the semiconductor substrate is a semiconductor substrate having holes with an aspect ratio shown in height/diameter of 1 or more.

2. The method according to claim 1, wherein the light irradiation is carried out by light having a wavelength of 193 nm to 700 nm.

3. The method according to claim 1, wherein the underlayer coating is formed without heating at a temperature that causes sublimation of a solid content contained in the applied coating.

4. The method according to claim 1, wherein the underlayer coating is formed without heating at a temperature of 150° C. or more.

5. The method according to claim 4, wherein the underlayer coating forming composition is a homogeneous solution in which each component of the homogeneous solution is dissolved in a solvent.

6. The method according to claim 5, wherein the solvent of the homogeneous solution is present in an amount such that the dissolved components of the homogeneous solution are 10 to 30 mass % of the homogeneous solution.

7. The method according to claim 5, wherein the solvent has a boiling point in the range of from 120 to 180° C.

8. The method according to claim 5, wherein the underlayer coating is formed without volatilization or sublimation of low molecular weight components contained in the applied coating.

9. A method for forming a laminated structure of an underlayer coating and a photoresist used in a lithography process for the manufacture of semiconductor devices, comprising:
applying an underlayer coating forming composition on a semiconductor substrate to form an applied coating, the underlayer coating forming composition comprising:
a polymerizable compound having at least one radical polymerizable ethylenically unsaturated bond, and
a photo-radical polymerization initiator, wherein the polymerizable compound having at least one radical polymerizable ethylenically unsaturated bond is a member selected from the group consisting of
an unsaturated carboxylic acid compound,
an unsaturated carboxylic acid amide compound,
a urethane compound that is obtained by reaction between a polyvalent isocyanate compound and a hydroxyalkyl unsaturated carboxylic acid ester compound,
a compound that is obtained by reaction between a polyvalent epoxy compound and a hydroxyalkyl unsaturated carboxylic acid ester compound,
a diallyl ester compound, and
a divinyl compound;
irradiating the applied coating with light to form an underlayer coating; and
applying a photoresist composition on the underlayer coating and heating it to form a photoresist; wherein
the semiconductor substrate is a semiconductor substrate having holes with an aspect ratio shown in height/diameter of 1 or more.

10. A method for forming a photoresist pattern used in a lithography process for the manufacture of semiconductor devices, comprising:
applying an underlayer coating forming composition on a semiconductor substrate to form an applied coating, the underlayer coating forming composition comprising:
a polymerizable compound having at least one radical polymerizable ethylenically unsaturated bond, and
a photo-radical polymerization initiator, wherein the polymerizable compound having at least one radical polymerizable ethylenically unsaturated bond is a member selected from the group consisting of
an unsaturated carboxylic acid compound,
an unsaturated carboxylic acid amide compound,
a urethane compound that is obtained by reaction between a polyvalent isocyanate compound and a hydroxyalkyl unsaturated carboxylic acid ester compound,
a compound that is obtained by reaction between a polyvalent epoxy compound and a hydroxyalkyl unsaturated carboxylic acid ester compound,
a diallyl ester compound, and
a divinyl compound;
irradiating the applied coating with light to form an underlayer coating;
applying a photoresist composition on the underlayer coating and heating it to form a photoresist;
exposing the semiconductor substrate coated with the underlayer coating and the photoresist to light; and
developing the photoresist after the exposure to light; wherein
the semiconductor substrate is a semiconductor substrate having holes with an aspect ratio shown in height/diameter of 1 or more.

11. The method according to claim 10, wherein the underlayer coating is formed without heating at a temperature that causes sublimation of a solid content contained in the applied coating.

12. The method according to claim 10, wherein the underlayer coating is formed without heating at a temperature of 150° C. or more.

13. The method according to claim 12, wherein the underlayer coating forming composition is a homogeneous solution in which each component of the homogeneous solution is dissolved in a solvent.

14. The method according to claim 13, wherein the solvent of the homogeneous solution is present in an amount such that the dissolved components of the homogeneous solution are 10 to 30 mass % of the homogeneous solution.

15. The method according to claim 13, wherein the solvent has a boiling point in the range of from 120 to 180° C.

16. The method according to claim 13, wherein the underlayer coating is formed without volatilization or sublimation of low molecular weight components contained in the applied coating.

* * * * *